United States Patent
Naritake

(10) Patent No.: US 6,339,560 B1
(45) Date of Patent: Jan. 15, 2002

(54) SEMICONDUCTOR MEMORY BASED ON ADDRESS TRANSITIONS

(75) Inventor: Isao Naritake, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/577,992

(22) Filed: May 25, 2000

(30) Foreign Application Priority Data

May 25, 1999 (JP) ............................................. 11-144618

(51) Int. Cl.[7] ................................................. G11C 8/00
(52) U.S. Cl. ................................. 365/233.5; 365/189.01
(58) Field of Search ........................... 365/233.5, 189.01

(56) References Cited

U.S. PATENT DOCUMENTS 5,471,591 A * 11/1995 Edmondson et al. ........ 395/375
5,917,839 A * 6/1999 Hashimoto et al. ........ 371/51.1

FOREIGN PATENT DOCUMENTS

| JP | 4-184791 | 7/1992 |
| JP | 9-34827 | 2/1997 |
| JP | 9-139075 | 5/1997 |
| JP | 10-340579 | 12/1998 |
| JP | 11-7764 | 1/1999 |

* cited by examiner

*Primary Examiner*—David Nelms
*Assistant Examiner*—M. Tran
(74) *Attorney, Agent, or Firm*—McGinn & Gibb, PLLC

(57) ABSTRACT

A dynamic semiconductor memory device for writing/reading out data in/from a memory cell via a write/read circuit determined by a word line selected by a row address and a bit line selected by a column address, and temporally holding burst-written/read data by a data latch arranged on a data line connected to the write/read circuit includes an address transition detection circuit and a read-after-write circuit. The address transition detection circuit detects an address change to generate an operation start instruction signal, and starts a write/read cycle in accordance with the operation start instruction signal. The read-after-write circuit detects a change from a write mode to a read mode to generate a read-after-write instruction signal. When the read-after-write instruction signal is generated, data held by the write/read circuit is transferred to the data latch, and when the data is held by the data latch and read is done for the same row address, the data held by the data latch is read out and output. A semiconductor memory device manufacturing method is also disclosed.

20 Claims, 7 Drawing Sheets

SEMICONDUCTOR MEMORY BASED ON ADDRESS TRANSITIONS

BACKGROUND OF THE INVENTION

1. Field of the Invention

The present invention relates to a semiconductor memory device and a method of manufacturing the same and, more particularly, to a dynamic semiconductor memory device suitable as the secondary cache memory of a microprocessor and a method of manufacturing the same.

2. Description of the Prior Art

Conventionally, the secondary cache memory of a microprocessor is formed from an off-chip type synchronous SRAM (Static Random Access Memory). The secondary cache interface of the microprocessor is generally designed on the assumption of the off-chip type synchronous SRAM.

With the development of micropatterning techniques, demands have arisen for embedding a secondary cache memory and a microprocessor on one chip.

To form a secondary cache memory on a chip, a DRAM (Dynamic Random Access Memory) small in memory size must be used to increase the memory capacity and improve the total performance of a microprocessor including the secondary cache memory.

A DRAM/logic embedding process of simultaneously manufacturing a DRAM and other logic circuits has already been practically available. If layout data of a conventional microprocessor is directly used as a macro, and a DRAM macro conforming to the secondary cache interface of the microprocessor is embedded, the design cost in forming a secondary cache memory on a chip is expected to greatly reduce.

In, however, a conventional microprocessor using an off-chip type synchronous SRAM as a secondary cache memory, a strobe signal for instructing the start of a read/write cycle that is suitable for controlling the DRAM does not exist in various control signals for the secondary cache memory. For this reason, a dynamic semiconductor memory device used as the secondary cache memory of a microprocessor requires a means for detecting an address change in order to activate a word line and start the read/write cycle when an address input in the previous cycle is compared with an address input in the current cycle to detect an address change.

The performance of data exchange via the secondary cache interface of a microprocessor improves with increasing bit width. However, if the bit width is too large, the number of I/O pins increases to enlarge the package. To prevent this, the multi-bit width of the secondary cache of an existing microprocessor is divided into several parts. Further, a data latch for temporarily latching write/read data is arranged to serially transfer data in a burst mode, thereby suppressing an increase in the number of I/O pins.

Hence, a dynamic semiconductor memory device used as the secondary cache memory of a microprocessor must also be equipped with such data latch so as to enable burst data transfer of 2 bits or more.

The dynamic semiconductor memory device used as the secondary cache memory of a microprocessor must execute the read cycle for the same row address as that for the write cycle immediately after the end of the write cycle. However, a conventional DRAM does not have any means for detecting the end of the write cycle in advance. Although desired data has already been transferred to the data latch by burst data transfer operation, the data cannot be read out.

For this reason, e.g., the row address is changed to execute a dummy read cycle, and then the row address is returned to the original one to start the read cycle, thereby executing normal operation. In this case, since the dummy read cycle (2-clock cycle) is inserted, the effective data transfer rate decreases.

SUMMARY OF THE INVENTION

The present invention has been made in consideration of the above situation in the prior art, and has as the first object to provide a dynamic semiconductor memory device which has a data latch to enable burst data transfer of 2 bits or more, can detect an address change to active a word line and start the read/write cycle, and can detect a change from the write cycle to the read cycle to execute the read cycle for the same row address as that for the write cycle immediately after the end of the write cycle.

It is the second object of the present invention to provide a semiconductor memory device manufacturing method capable of reducing the design cost in forming a microprocessor and its secondary cache memory on a chip.

To achieve the first object, according to the first main aspect of the present invention, there is provided a dynamic semiconductor memory device for writing/reading out data in/from a memory cell via write/read means determined by a word line selected by a row address and a bit line selected by a column address, and temporally holding burst-written/read data by a data latch arranged on a data line connected to the write/read means, comprising address transition detection means for detecting an address change to generate an operation start instruction signal, and starting a write/read cycle in accordance with the operation start instruction signal, and read-after-write means for detecting a change from a write mode to a read mode to generate a read-after-write instruction signal, wherein when the read-after-write instruction signal is generated, data held by the write/read means is transferred to the data latch, and when the data is held by the data latch and read is done for the same row address, the data held by the data latch is read out and output.

The present invention comprises the following secondary aspects in addition to the first main aspect.

The address transition detection means comprises a plurality of address registers for holding a plurality of external row address signals, respectively, and an operation start instruction signal generation circuit for comparing row addresses in a previous write/read cycle with row addresses in a current write/read cycle in the plurality of address registers, and when the row addresses change as a result of comparison, generating the operation start instruction signal.

The read-after-write means comprises a write mode register for holding an external write mode signal, and an instruction signal generation circuit for outputting the read-after-write instruction signal when a signal obtained by delaying an output signal from the write mode register by one clock period changes from the write mode to the read mode.

The semiconductor memory device of the present invention is a secondary cache memory combined with a microprocessor.

The semiconductor memory device of the present invention may be mounted on the same chip as the microprocessor, or may be arranged outside a chip of the microprocessor.

To achieve the second object, according to the second main aspect of the present invention, there is provided a semiconductor memory device manufacturing method comprising the step of mounting, on one chip using a DRAM/logic embedding process, a layout macro of a microprocessor and a layout macro of a semiconductor memory device conforming to a secondary cache interface of the microprocessor.

As is apparent from the above aspects, in the arrangement of the present invention, a semiconductor memory device which comprises the data latch on a data line connected to the write/read means to burst-write/read out data detects an address change to generate an operation start instruction signal, and starts the write/read cycle in accordance with the operation start instruction signal. When the semiconductor memory device uses the secondary cache of a microprocessor in which a strobe signal for instructing the start of the read/write cycle that is suitable for controlling a DRAM does not exist in various control signals for the secondary cache interface, the word line can be activated to start the read/write cycle. At the same time, a change from the write mode to the read mode is detected to generate a read-after-write instruction signal, and data held by the write/read means is transferred to the data latch and latched in accordance with the read-after-write instruction signal. In performing read operation for the same row address, the held data is read out and output. Immediately after the write cycle, the read cycle for the same row address can be executed.

According to the semiconductor memory device manufacturing method of the present invention, the layout macro of a microprocessor and the layout macro of the semiconductor memory device according to the present invention conforming to the secondary cache interface of the microprocessor are embedded on one chip by a DRAM/logic embedding process. This can reduce the design cost in forming the secondary cache memory on a chip.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

A preferred embodiment of the present invention will be described below with reference to the accompanying drawings.

Figure 1:
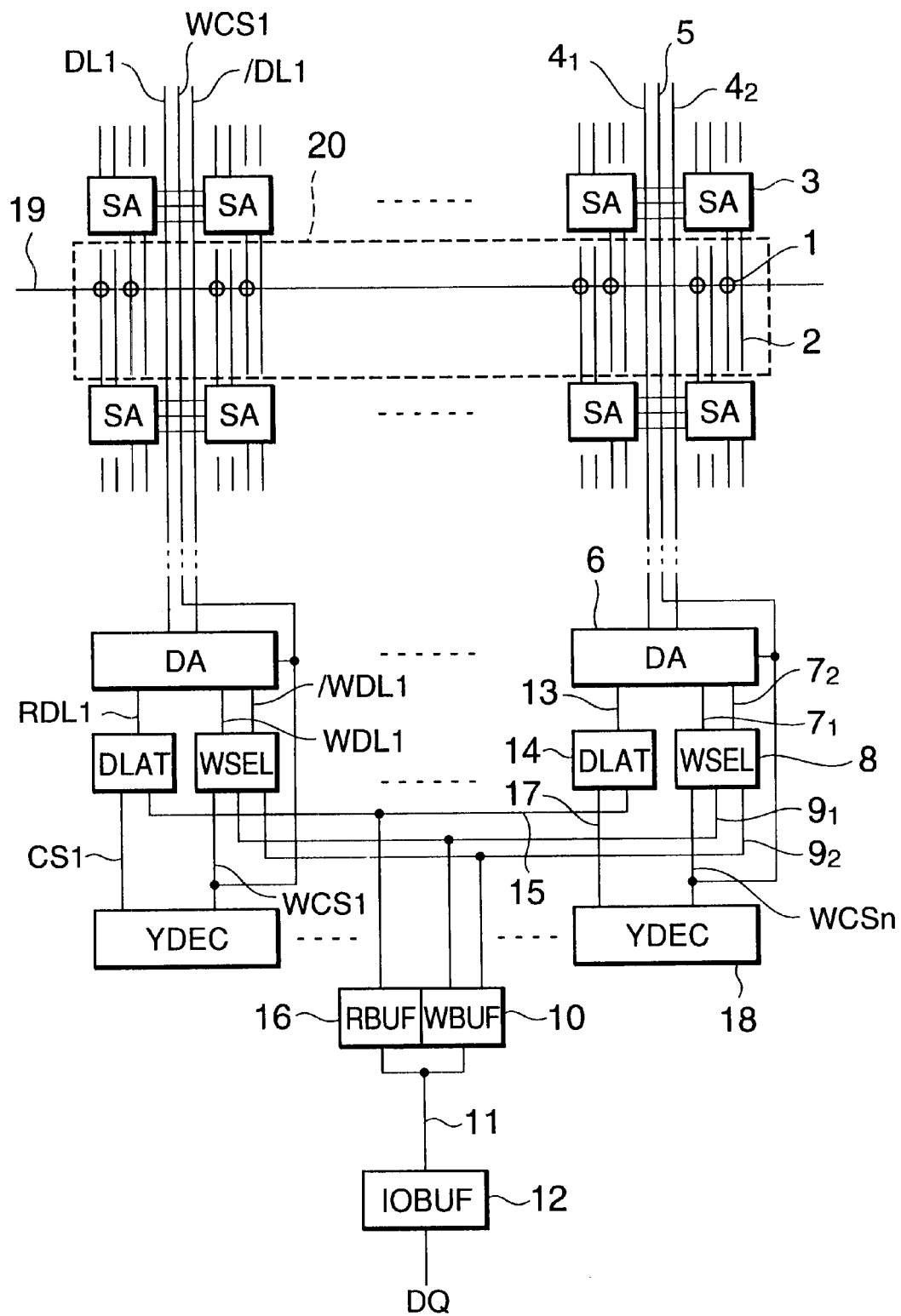
FIG. 1 is a block circuit diagram showing the array arrangement of a dynamic semiconductor memory device according to an embodiment of the present invention.

As shown in FIG. 1, the semiconductor memory device of this embodiment is mainly constituted by memory cells 1, bit lines 2, sense amplifiers SA 3, data lines DLn $4_1$ and /Dln $4_2$, write column switch signal lines WCSn 5, data amplifiers DA 6, write data lines WDLn $7_1$ and /WDLn $7_2$, write selectors WSEL 8, write buses WBUS $9_1$ and /WBUS $9_2$, a write buffer WBUF 10, an IO bus IOB 11, an IO buffer IOBUF 12, read data lines RDLn 13, data latches DLAT 14, a read bus RBUS 15, a read buffer RBUF 16, column switch signal lines CSn 17, column decoders YDEC 18, word lines WL 19, and a memory cell array 20.

In the semiconductor memory device of this embodiment, one sense amplifier SA 3 is arranged for a pair of bit lines 2 connected to a plurality of memory cells 1. A pair of data lines DLn $4_1$ and /Dln $4_2$ run parallel to the bit lines 2 using a first wiring layer (not shown) for a plurality of sense amplifiers SA. One write column switch signal line WCSn 5 runs parallel to the data lines DLn and /DLn using the first wiring layer (or another wiring layer; not shown) for a pair of data lines DLn and /DLn. A pair of data lines DLn and /DLn correspond to one column address, and are connected to one data amplifier DA 6. The data amplifier DA is connected to a corresponding write selector WSEL 8 via a pair of write data lines WDLn $7_1$ and /WDLn $7_2$. A pair of write buses WBUS $9_1$ and /WBUS $9_2$ are arranged commonly for n write selectors WSEL, and connected to the write buffer WBUF 10. The write buffer WBUF 10 is connected to the IO buffer IOBUF 12 via the IO bus IOB 11. The IO buffer IOBUF exchanges data with external circuits.

Each data amplifier DA 6 is connected to a corresponding data latch DLAT 14 via the read data line RDLn 13. One read bus RBUS 15 is arranged commonly for n data latches DLAT, and connected to the read buffer RBUF 16. The read buffer RBUF 16 is connected to the IO buffer IOBUF 12 via the IO bus IOB 11.

Each write column switch signal line WCSn 5 and each column switch signal line CSn 17 are connected to a corresponding column decoder YDEC 18.

The arrangement of the memory cell array 20 shown in FIG. 1 corresponds to one IO (Input/Output). In practice, a number of arrays corresponding to the number of IOs are arranged.

The operation of the dynamic semiconductor memory device according to this embodiment will be explained with reference to FIG. 1.

In write, the column decoder YDEC 18 outputs a write column switch signal WCSn to active the write selector WSEL, data amplifier DA, and sense amplifier SA. In read, the column decoder YDEC 18 outputs a column switch signal CSn to active the data latch DLAT.

In the write cycle, the write selector WSEL is activated by the write column switch signal WCSn as an output from the column decoder YDEC. Of n write column switch signals WCS1 to WCSn, only one signal is selected by an externally input Y address to activate one write selector WSEL. Then, data of the write buffer WBUS is transferred to the data amplifier DA as write data WDLn and /WDLn via corresponding write buses WBUS and /WBUS.

In the read cycle, the data latch DLAT is activated by the column switch signal CSn as an output from the column decoder YDEC. Of n column switch signals CS1 to CSn, only one signal is selected by an externally input Y address to activate one data latch DLAT. Then, data of the activated data latch is transferred to the read buffer RBUF via the read bus RBUS.

Each word line WL is connected to $4n$ memory cells. If read operation starts to activate the word line WL, data of the 4n memory cells are transferred to the 4n sense amplifiers SA where the data are amplified. Of outputs from the 4n sense amplifiers, n data are transferred to the data amplifier DA via the data lines DLn and /DLn. The data transferred to the data amplifier DA are latched by the data latch DLAT via the read data line RDLn. The data latched by the data latch DLAT selected by the column switch CSn are sequentially transferred to the read buffer RBUF, and read out to the outside via the IO buffer IOBUF 12.

An arrangement of the sense amplifier SA in this embodiment will be described with reference to FIG. 2.

Figure 2:
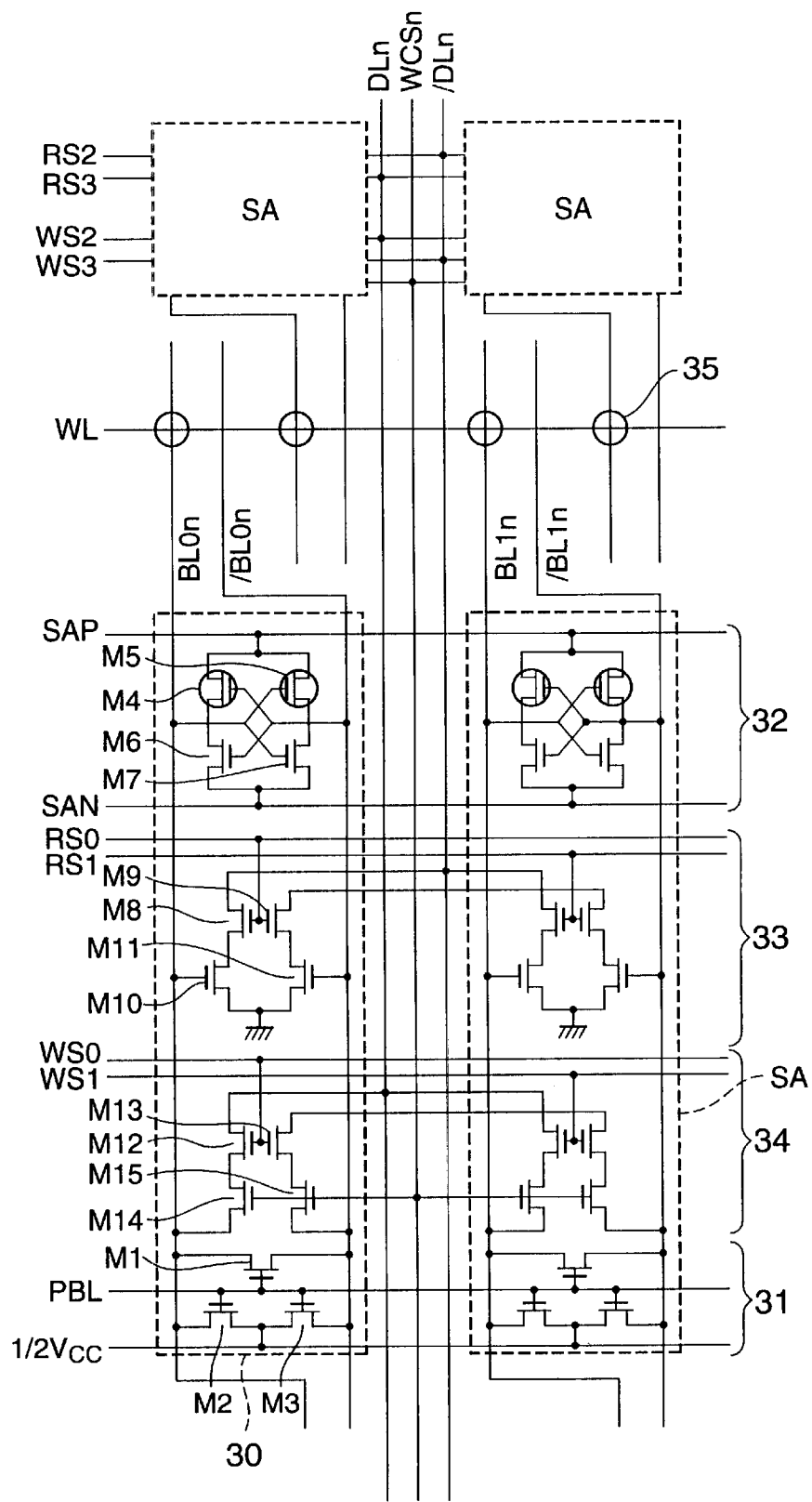
FIG. 2 is a block circuit diagram showing an arrangement of a sense amplifier in the embodiment shown in FIG. 1.

As shown in FIG. 2, each sense amplifier SA 30 is primarily comprised of a precharge circuit 31, amplifier circuit 32, read circuit 33, and write circuit 34.

The precharge circuit 31 has transistors M1, M2, and M3, and precharges the potentials of bit lines BL0n and /BL0n to predetermined potentials at the start of the write/read cycle. The amplifier circuit 32 has transistors M4, M5, M6, and M7, and amplifies low voltages read out from a memory cell 35 to the bit lines BL0n and /BL0n in read. The read circuit 33 has transistors M8, M9, M10, and M11, and is activated in accordance with a read switch signal RS0 to transfer read data on the bit lines BL0n and /BL0n to the data lines DLn and /DLn. The write circuit 34 has transistors M12, M13, M14, and M15, is activated in accordance with the write column switch signal WCSn, and writes write data on the data lines DLn and /DLn in the memory cell 35 via the bit lines BL0n and /BL0n.

The operation of the sense amplifier SA according to this embodiment will be explained with reference to FIG. 2. In the standby mode, a bit line precharge signal PBL is at H (High) level. When the bit line precharge signal PBL is at H level, all the transistors M1, M2, and M3 are ON, and a voltage of ½ Vcc (Vcc is the power supply voltage) level is applied to the bit lines BL0n and /BL0n.

If the bit line precharge signal PBL changes to L (Low) level to activate a word line WL to which a given memory cell 35 is connected, data held in the memory cell 35 is read out as a small potential difference onto a pair of bit lines BL0n and /BL0n. After that, sense amplifier power lines SAP and SAN at ½ level are activated to Vcc and GND (GrouND) levels, respectively. The transistors M4 to M7 in the amplifier circuit 32 are turned on/off in accordance with readout data to amplify the small potential difference on the bit lines.

If, e.g., the read switch signal RS0 is activated to H level while data on the bit lines are amplified, data on the bit lines BL0n and /BL0n are transferred to the data lines DLn and /DLn. That is, if the read switch signal RS0 is activated when the bit lines BL0n and /BL0n are at H and L levels, respectively, the transistors MB and M10 are turned on to decrease the potential of the data line /DLn precharged to ½. Although the transistor M9 is turned on, the transistor M11 is not turned on, and thus the data line DLn remains at ½ level.

In the write cycle, data on selected data lines DLn and /DLn are amplified to Vcc or GND level by the data amplifier DA. Similarly, a selected write column switch signal WCSn is activated to H level. At this time, if, e.g., a write switch signal WS0 is activated, the transistors M12 to M15 are turned on to transfer data on the data lines DLn and /DLn to the bit lines BL0n and /BL0n, and write the data in the memory cell 35.

Figure 3:
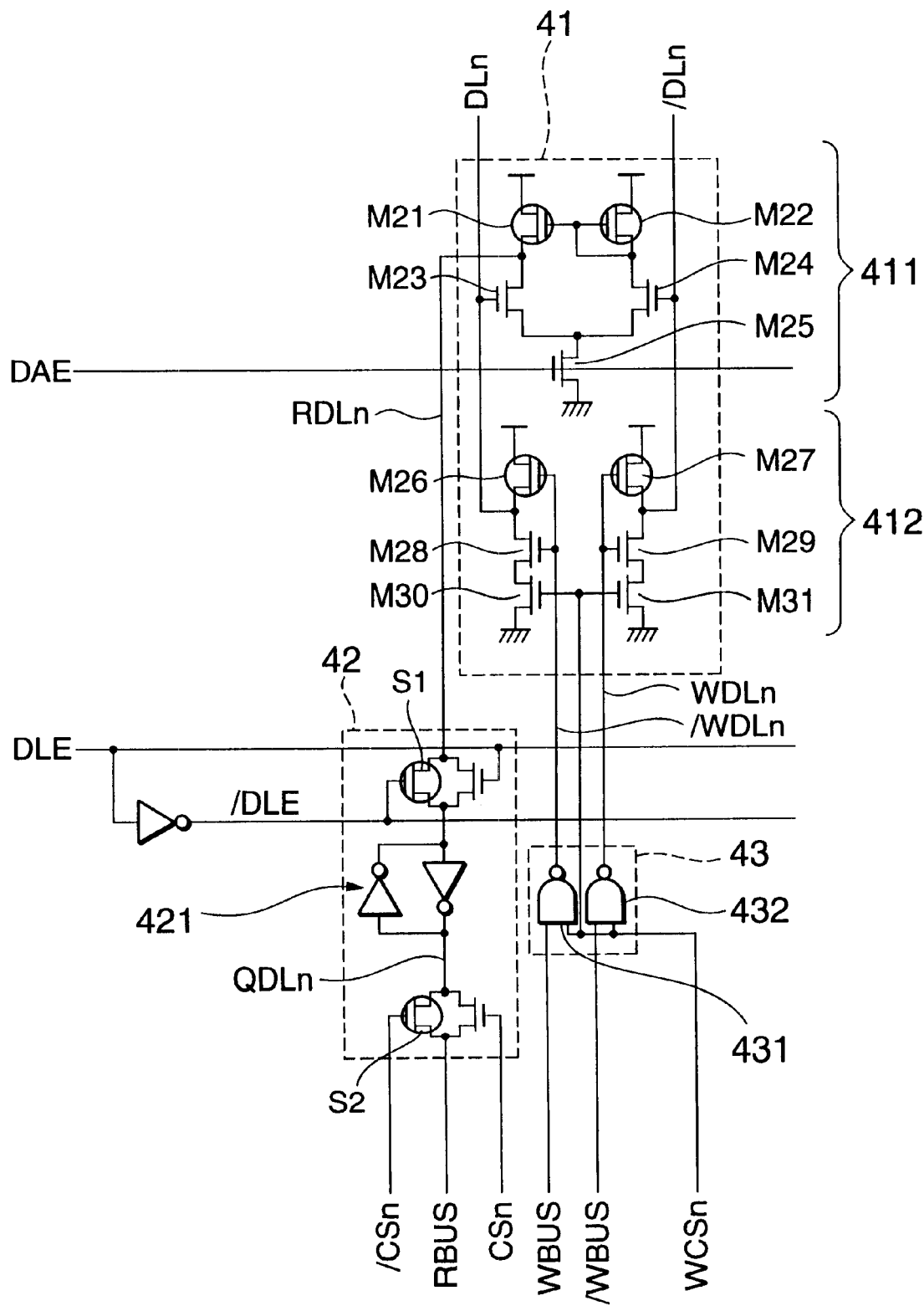
FIG. 3 is a block circuit diagram showing arrangements of a data amplifier, data latch, and write selector in the embodiment shown in FIG. 1.

Arrangements of the data amplifier DA, data latch DLAT, and write selector WSEL in this embodiment will be explained with reference to FIG. 3.

A data amplifier DA 41 in this embodiment comprises a read circuit 411 and write circuit 412. The read circuit 411 has transistors M21, M22, M23, M24, and M25, and is activated in accordance with a data amplifier activation signal DAE to amplify readout data on the data lines DLn and /DLn and output the amplified data to the read data line RDLn. The write circuit 412 has transistors M26, M27, M28, M29, M30, and M31, and is activated in accordance with the write column switch signal WCSn to output write data on the write data lines WDLn and /WDLn to the data lines DLn and /DLn.

The data latch DLAT 42 has switches S1 and S2 and a latch 421. When the switch S1 is turned on in accordance with data latch control signals DLE and /DLE, the data latch DLAT 42 latches read data RDLn by the latch 421. When the switch S2 is turned on in accordance with column switch signals CSn and /CSn, the data latch DLAT 42 outputs latched data QDLn to the read bus RBUS.

A write selector WSEL 43 has NAND circuits 431 and 432. When the NAND circuits 431 and 432 are turned on in accordance with the write column switch signal WCSn, the write selector WSEL 43 outputs write data on the write buses WBUS and /WBUS to the write data lines WDLn and /WDLn.

The operations of the data amplifier DA, data latch DLAT, and write selector WSEL will be explained with reference to FIG. 3.

If the data amplifier activation signal DAE rises to H level, read data on the data lines DLn and /DLn are amplified by the read circuit 411 and transferred to the read data line RDLn. The data latch control signal DLE is activated to H level to turn on the switch S1, and data on the read data line RDLn is latched by the latch 421 in the data latch DLAT. If column switch signals CSn and /CSn selected by an Y address are respectively activated to H and L levels, the switch S2 is turned on to transfer the data QDLn latched by the latch 421 to the read bus RBUS.

In the write cycle, write data are transferred to the complementary write buses WBUS and /WBUS via the write buffer WBUF 10 shown in FIG. 1. If a write column switch signal WCSn selected by an Y address is activated, the write selector WSEL is activated, and one of the write data lines WDLn and /WDLn serving as the complementary outputs of the write selector WSEL falls from H level to L level. At the same time, the write circuit 412 in the data amplifier DA is activated by the write column switch signal WCSn, and the complementary data lines DLn and /DLn are respectively activated to Vcc and GND levels in accordance with write data.

In a data amplifier DA not selected by the write column switch signal WCSn, the write column switch signal WCSn serving as the input of the data amplifier DA is at L level, and both the write data lines WDLn and /WDLn are at H level. Thus, the write circuit 412 in the data amplifier DA is not activated, and the data lines DLn and /DLn stay precharged at ½ level.

The data amplifier activation signal DAE and data latch control signals DLE and /DLE are common to n columns. The lines of the data latch control signals DLE and /DLE are perpendicular to the data lines DLn and /DLn.

An arrangement and operation of an address transition detection circuit in this embodiment will be described with reference to FIG. 4.

Figure 4:
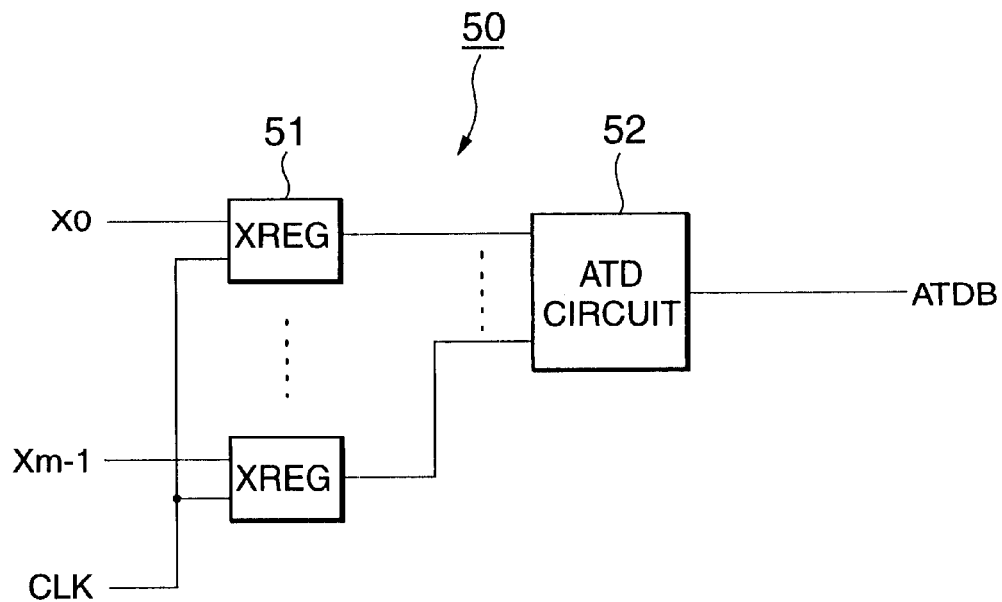
FIG. 4 is a block diagram showing an arrangement of an address transition detection circuit in the embodiment shown in FIG. 1.

As shown in FIG. 4, an address transition detection circuit 50 of this embodiment is constituted by connecting a plurality of external row address signals X0 to Xm-1 to an ATD (Address Transition Detector) circuit 52 via address registers XREG 51. The external row address signals X0 to Xm-1 are received by corresponding address registers XREG. The address registers XREG receive a clock signal CLK, and store the external row address signals X0 to Xm-1 at the leading edge timing of the clock signal CLK. Internal address signals as outputs from the address registers XREG are input to the ATD circuit 52. The ATD circuit 52 compares an internal row address signal in the previous cycle with an internal row address signal in the current cycle, and if the row address signal has changed, outputs an ATD signal (operation start instruction signal) ATDB as a low-active one-shot signal. When this ATD signal ATDB is output, the dynamic semiconductor memory device of this embodiment starts operation.

An arrangement and operation of a read-after-write circuit in this embodiment will be described with reference to FIG. 5.

Figure 5:
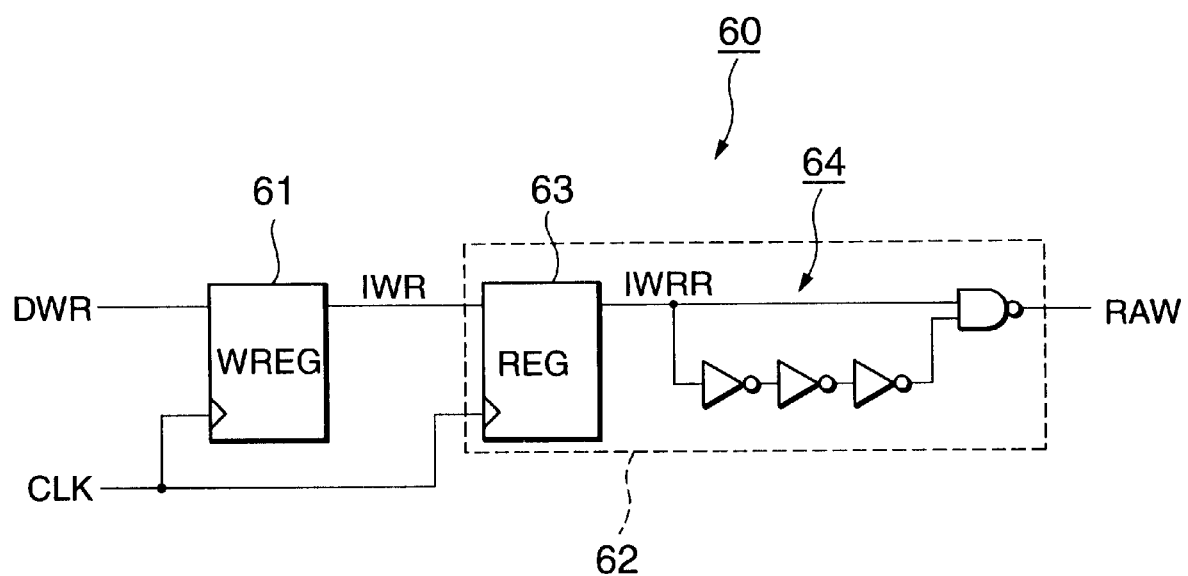
FIG. 5 is a block diagram showing an arrangement of a read-after-write circuit in the embodiment shown in FIG. 1.

In a read-after-write circuit 60 of this embodiment, as shown in FIG. 5, an external write mode signal DWR is input to a RAW (Read After Write) circuit 62 via a write mode register WREG 61.

The external write mode signal DWR is received by the write mode register WREG and output as an internal write mode signal IWR at the leading edge timing of the clock signal CLK. Both the external and internal write mode signals DWR and IWR are low-active signals. When these signals are at L level, the dynamic semiconductor memory device of this embodiment shifts to the write mode; and when these signals are at H level, to the read mode.

The internal write mode signal IWR is received by a register REG 63 in the RAW circuit 62 at the leading edge timing of the clock signal CLK. An output IWRR from the register REG in the RAW circuit 62 is a signal obtained by delaying the timing of the internal write mode signal IWR by one clock. The signal IWRR is input to an one-shot circuit 64 in the RAW circuit 62, and the one-shot circuit 64 outputs a one-shot signal (read-after-write instruction signal) RAW as an output signal from the RAW circuit 62. The one-shot signal RAW is output when the signal IWRR rises from L level (write mode) to H level (read mode).

Figure 6:
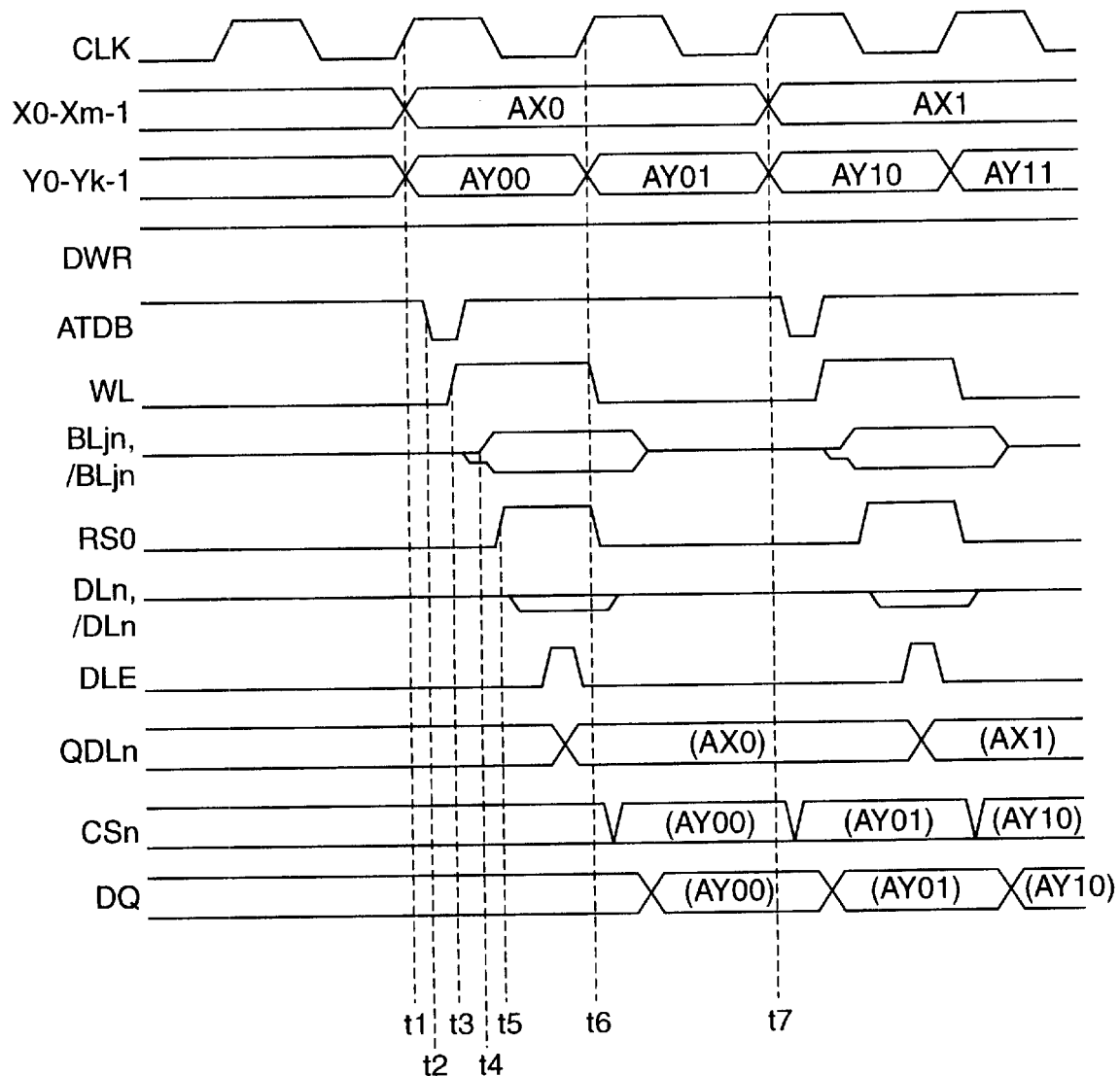
FIG. 6 is a timing chart for explaining the operation of the read cycle in the embodiment shown in FIG. 1.
Figure 7:
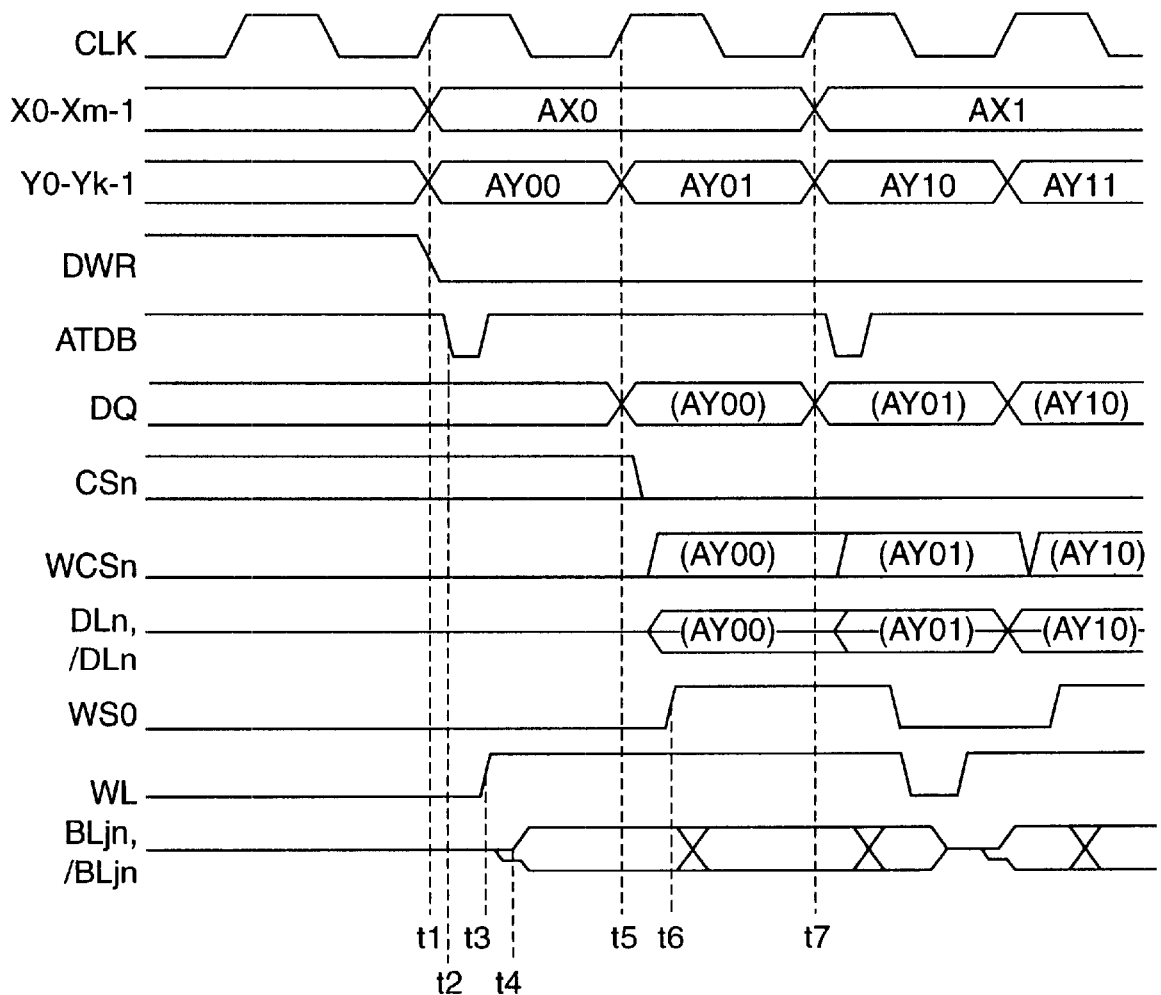
FIG. 7 is a timing chart for explaining the operation of the write cycle in the embodiment shown in FIG. 1.
Figure 8:
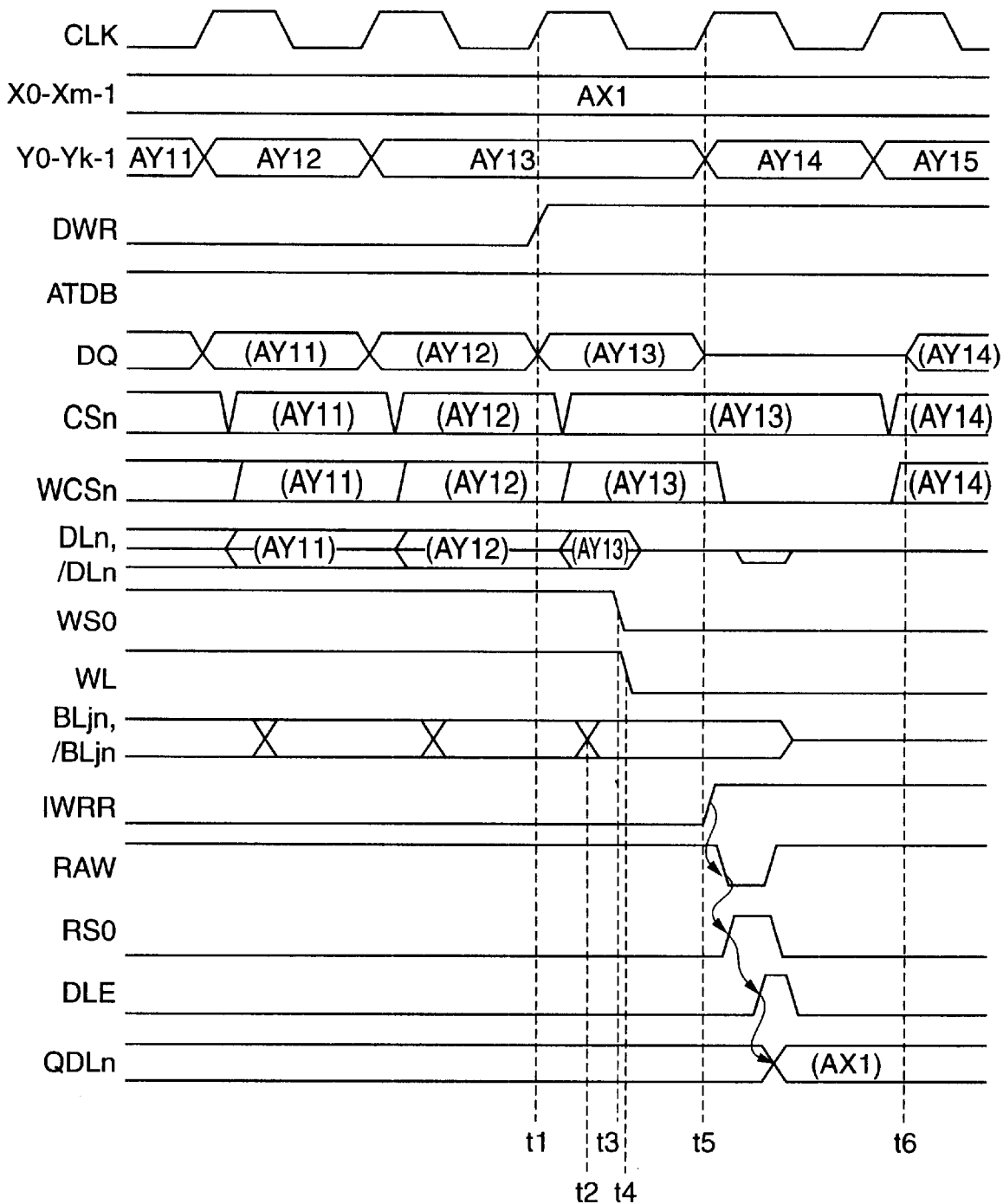
FIG. 8 is a timing chart showing an operation at the end of write in the embodiment shown in FIG. 1.

The operation of the circuit shown in FIGS. 1 to 5 will be explained with reference to FIGS. 6 to 8.

The dynamic semiconductor memory device of the present invention is designed on the assumption that the device is used as an on- or off-chip type secondary cache memory for a microprocessor. The secondary cache of a microprocessor is conventionally formed from an off-chip type synchronous SRAM. For this reason, a strobe signal for instructing the start of the read/write cycle that is suitable for controlling the DRAM does not exist in various control signals for the secondary cache interface of the microprocessor. For this reason, the dynamic semiconductor memory device of the present invention incorporates the address transition detection circuit for detecting an address change in order to start the read/write cycle when an address input in the previous cycle is compared with an address input in the current cycle to detect an address change.

The performance of data exchange via the secondary cache interface of a microprocessor improves with increasing bit width. However, if the bit width is too large, the number of I/O pins increases to enlarge the package. To prevent this, the multi-bit width in the secondary cache of an existing microprocessor is divided into several parts, and data are serially transferred in a burst mode, thereby suppressing an increase in the number of I/O pins. The dynamic semiconductor memory device of the present invention is also designed on the assumption of burst data transfer of 2 bits or more.

The operation of the read cycle in the dynamic semiconductor memory device of the present invention will be described with reference to FIG. 6.

If a row address AX0 different from that in the previous cycle is input at the leading edge of the clock signal CLK at time t1, the address transition detection circuit shown in FIG. 4 detects this, and outputs the one-shot signal ATDB at time t2. Since the one-shot signal ATDB representing the start of the operation cycle is output, the internal circuit (not shown) of the semiconductor memory device starts operation, and a word line WL corresponding to the input row address AX0 is activated at time t3. Then, data of a memory cell connected to the word line WL is read out as a low potential to bit lines BLjn and /BLjn to activate the sense amplifier power lines SAP and SAN at time t4. Accordingly, data on the bit lines are amplified to Vcc and GND levels, respectively.

At time t5, the read switch signal RS0 is activated to transfer data on the bit lines to the data lines DLn and /DLn. The transferred data on the data lines are amplified by the data amplifier DA, and after the data latch control signal DLE is activated, are transferred to the data latch DLAT. As a result, the output signal QDLn of the latch 421 is rewritten by the current readout data. At this time, readout data from all the n columns are simultaneously transferred to the n data latches DLAT.

A column address AY00 internally received in response to the clock CLK at time t1 is temporarily held by a column address register (not shown), and transferred to the column decoder YDEC at the leading edge timing of the clock signal at time t6. A column switch signal CSn corresponding to the column address AY00 rises. Then, the data QDLn of a data latch DLAT selected by the column switch signal CSn is output to the read bus RBUS, output to the IO bus IOB via the read buffer RBUF, and output to the outside as readout data DQ via the IO buffer IOBUF.

A next column address AY01 input at time t6 is input to the column decoder YDEC at the leading edge timing of the clock signal CLK at time t7. A corresponding column switch signal CSn rises to read out corresponding readout data from the data latch DLAT.

The dynamic semiconductor memory device of the present invention assumes burst read/write operation of 2 bits or more. For this reason, if a input row address changes to AX0 at time t1, the row address must not change at time t6 at which the next clock rises. At time t7, the row address may change to another row address AX1, as shown in FIG. 6.

The operation of the write cycle in the dynamic semiconductor memory device of the present invention will be described with reference to FIG. 7.

If the row address AX0 is input at the leading edge of the clock signal CLK at time t1, and at the same time the external write mode signal DWR falls from H level to L level, the address transition detection circuit detects an address change and outputs the one-shot signal ATDB at time t2. In the read-after-write circuit, the internal write mode signal IWR falls to L level. Since the one-shot signal ATDB representing the start of the cycle is output, the internal circuit (not shown) starts operation, and a word line WL corresponding to the input row address AX0 is activated at time t3. Then, data of each memory cell connected to the word line WL is read out as a small potential difference to the bit lines BLjn and /BLjn to activate the sense amplifier power lines SAP and SAN at time t4. Data on the bit lines are amplified via the amplifier circuit 32 to Vcc and GND levels, respectively.

The column address AY009 internally received in response to the clock CLK at time t1 is temporarily held by the column address register (not shown), and transferred to the column decoder YDEC at the leading edge timing of the clock signal at time t5. Because of the write cycle, one write column switch WCSn corresponding to the column address AY00 is turned on. At the same time, write data to be written in a column corresponding to the column address AY00 received at the leading edge timing of the clock signal at time t5 is output to the IO bus IOB via the IO buffer IOBU, and transferred to the write buses WBUS and /WBUS via the write buffer WBUS.

Thereafter, a write selector WSEL selected by a write column switch signal WCSn corresponding to the column address AY00 is activated to transfer the write data WDLn and /WDLn to the data amplifier DA of a corresponding column. The data amplifier DA is also activated by the write column switch signal WCSn to amplify data on the data lines DLn and /DLn of the corresponding column to Vcc and GND levels by the write data WDLn and /WDLn. At time t6, the write switch signal WSO is activated to transfer data on the data lines DLn and /DLn to corresponding bit lines via the sense amplifier SA.

Data to be written in a column corresponding to a next column address AY01 internally received in response to the clock signal CLK at time t5 is internally received at the leading edge timing of the clock signal at time t7. A write column switch signal WCSn corresponding to the column address AY01 is activated, and write data is similarly transferred to corresponding bit lines.

In the secondary cache interface assumed for the dynamic semiconductor memory device of the present invention, write data is input with a delay by one clock from a corresponding column address.

Similar to the read cycle, the write cycle also assumes burst write operation of 2 bits or more. If an input row address changes to AX0 at time t1, the row address must not change at time t5 at which the next clock rises. At time t7 at which the second next clock rises, the row address may change to another row address AX1, as shown in FIG. 7. If the write cycle is to continue, the external write mode signal DWR must maintain L level, as shown in FIG. 7.

An operation at the end of the write cycle in the dynamic semiconductor memory device of the present invention will be described with reference to FIG. 8.

The write cycle ends when the external write mode signal DWR changes to H level at the same time as input of the last write data. Write data corresponding to the last column address AY13 is received at the leading edge timing of the clock signal CLK at time t1 shown in FIG. 8. At the same time, a change in the external write mode signal DWR to H level is also internally received.

When write data corresponding to the column address AY13 is transferred to the bit lines at time t2 via the above-describe route, the write switch signal WSO falls to L level at time t3. At time t4, the word line WL is inactivated to precharge the data lines DLn and /DLn to ½ level. At the leading edge timing of the clock signal at time t5, the signal IWRR in the read-after-write circuit rises, and a one-shot signal is output as the signal RAW.

Subsequently, the read switch signal RS0 is activated. Data corresponding to the row address AX1 that is held by the sense amplifier SA and bit lines is transferred to the data lines DLn and /DLn, and amplified by the data amplifier DA. After the data latch control signal DLE is activated, the amplified data is transferred to the data latch DLAT to change the output signal QDLn of the latch 421. Accordingly, data corresponding to a column address AY14 received at time t5 can be externally read out as external output data DQ at time t6.

In this manner, the semiconductor memory device of the embodiment additionally comprises the read-after-write circuit. Assume that immediately after the end of the write cycle, the read cycle for the same row address is executed. In this case, since the row address does not change from the previous cycle, the address transition detection circuit does not operate, and the word line is not activated. However, desired data has already been transferred to the data latch, and can be read out only by changing the column address.

If no read-after-write circuit is adopted, e.g., the row address is changed to execute a dummy read cycle. Then, the row address is returned to the original one to start the read cycle, thereby executing normal operation. In this case, since the dummy read cycle (2-clock cycle) is inserted, the effective data transfer rate decreases.

The embodiment of the present invention has been described in detail with reference to the accompanying drawings. However, a detailed arrangement is not limited to the above embodiment, and the design may be changed within the spirit and scope of the present invention. For example, the embodiment has exemplified burst transfer of 2-bit data. The present invention is not limited to this, and can be applied to data of more than 2 bits. As a semiconductor memory device manufacturing method according to the present invention, the layout macro of a microprocessor and the layout macro of the semiconductor memory device according to the present invention conforming to the secondary cache interface of the microprocessor can be embedded on one chip by a DRAM/logic embedding process. This can greatly reduce the chip design cost.

What is claimed is:

1. A dynamic semiconductor memory device for writing/reading out data in/from a memory cell via a write/read circuit as determined by a word line selected by a row address and a bit line selected by a column address, and temporally holding burst-written/read data by a data latch arranged on a data line connected to said write/read circuit, said device comprising:

an address transition detector detecting an address change to generate an operation start instruction signal starting a write/read cycle; and a read-after-write transition detector detecting a change from a write mode to a read mode to generate a read-after-write instruction signal, wherein when the read-after-write instruction signal is generated, data held by said write/read circuit is transferred to said data latch, and when the data is held by said data latch and read is done for the same row address, the data held by said data latch is read out and output.

2. A device according to claim 1, wherein said semiconductor memory device comprises a secondary cache memory servicing a microprocessor.

3. A device according to claim 2, wherein said semiconductor memory device is mounted on the same chip as said microprocessor.

4. A device according to claim 2, wherein said semiconductor memory device is mounted outside a chip containing said microprocessor.

5. A dynamic semiconductor memory device for writing/reading out data in/from a memory cell via a write/read circuit as determined by a word line selected by a row address and a bit line selected by a column address, and temporally holding burst-written/read data by a data latch arranged on a data line connected to said write/read circuit, said device comprising:

an address transition detector detecting an address change to generate an operation start instruction signal starting a write/read cycle; and a read-after-write transition detector detecting a change from a write mode to a read mode to generate a read-after-write instruction signal, wherein when the read-after-write instruction signal is generated, data held by said write/read circuit is transferred to said data latch, and when the data is held by said data latch and read is done for the same row address, the data held by said data latch is read out and output, wherein said address transition detector comprises:

a plurality of address registers for holding a plurality of external row address signals, respectively; and an operation start instruction signal generation circuit for comparing row addresses in a previous write/read cycle with row addresses in a current write/read cycle in said plurality of address registers, and when the row addresses change as a result of comparison, generating the operation start instruction signal.

6. A device according to claim 5, wherein said semiconductor memory device comprises a secondary cache memory servicing a microprocessor.

7. A device according to claim 6, wherein said semiconductor memory device is mounted on the same chip as said microprocessor.

8. A device according to claim 6, wherein said semiconductor memory device is mounted outside a chip containing said microprocessor.

9. A dynamic semiconductor memory device for writing/reading out data in/from a memory cell via a write/read circuit as determined by a word line selected by a row address and a bit line selected by a column address, and temporally holding burst-written/read data by a data latch arranged on a data line connected to said write/read circuit, said device comprising:

an address transition detector detecting an address change to generate an operation start instruction signal starting a write/read cycle; and a read-after-write transition detector detecting a change from a write mode to a read mode to generate a read-after-write instruction signal, wherein when the read-after-write instruction signal is generated, data held by said write/read circuit is transferred to said data latch, and when the data is held by said data latch and read is done for the same row address, the data held by said data latch is read out and output, wherein said read-after-write transition detector comprises:

a write mode register for holding an external write mode signal; and an instruction signal generation circuit for outputting the read-after-write instruction signal when a signal obtained by delaying an output signal from said write mode register by one clock period changes from a write mode to a read mode.

10. A device according to claim 9, wherein said semiconductor memory device comprises a secondary cache memory servicing a microprocessor.

11. A device according to claim 10, wherein said semiconductor memory device is mounted on the same chip as said microprocessor.

12. A device according to claim 10, wherein said semiconductor memory device is mounted outside a chip containing said microprocessor.

13. A method of increasing memory read/write speed in a computer memory having a plurality of data memory cells, each said data memory cell having a data memory cell address, and an address memory unit storing the data memory cell address for the next memory read/write operation, said method comprising:

detecting that a contents of said address memory unit has changed compared to a corresponding said contents of an immediately previous timing cycle; and initiating a sequence of read/write instructions based on having detected that said change has occurred.

14. A computer memory comprising:

a plurality of data memory cells, each having an address;

an address storage section storing a data memory cell address for the next of an operation to read data from or to write data into at least one selected data memory cell location;

a detector determining that a contents of said address storage section has changed compared to a corresponding said contents of an immediately previous timing cycle; and a controller executing a sequence of read or write instructions based upon having received an indication from said detector that said address contents has changed.

15. The computer memory of claim 14, wherein each said read or write sequence involves a preset plurality of said data memory cell addresses.

16. The computer memory of claim 14, further comprising a data latch for data involved in said sequence of read or write instructions to be executed.

17. The computer memory of claim 14, further comprising;

a write mode register holding an external write mode signal; and a signal generator outputting a read-after-write instruction signal when contents of said write mode register changes from a write mode to a read mode.

18. A computer comprising:

at least one microprocessor; and at least one computer memory, each comprising:

a plurality of data memory cells, each having an address;

an address storage section storing a data memory cell address for the next of an operation to read data from or to write data into at least one selected data memory cell location;

a detector determining that a contents of said address storage section has changed compared to a corresponding said contents of an immediately previous timing cycle; and a controller executing a sequence of read or write instructions based upon having received an indication from said detector that said address contents has changed.

19. An electronic chip comprising:

at least one computer memory, each comprising:

a plurality of data memory cells, each having an address;

an address storage section storing a data memory cell address for the next of an operation to read data from or to write data into at least one selected data memory cell location;

a detector determining that a contents of said address storage section has changed compared to a corresponding said contents of an immediately previous timing cycle; and a controller executing a sequence of read or write instructions based upon having received an indication from said detector that said address contents has changed.

20. An electronic chip comprising a computer, said computer comprising:

at least one microprocessor; and at least one computer memory, each comprising:

a plurality of data memory cells, each having an address;

an address storage section storing a data memory cell address for the next of an operation to read data from or to write data into at least one selected data memory cell location;

a detector determining that a contents of said address storage section has changed compared to a corresponding said contents of an immediately previous timing cycle; and a controller executing a sequence of read or write instructions based upon having received an indication from said detector that said address contents has changed.

* * * * *